(12) United States Patent
Basappa et al.

(10) Patent No.: US 8,001,503 B2
(45) Date of Patent: Aug. 16, 2011

(54) METHOD AND SYSTEM FOR AUTOMATICALLY ACCESSING INTERNAL SIGNALS OR PORTS IN A DESIGN HIERARCHY

(75) Inventors: Jayashri Arsikere Basappa, Karnataka (IN); Sandeep Niranjan Tippannanavar, Karnataka (IN); Venkatasreekanth Prudvi, Pradesh (IN)

(73) Assignee: International Business Machines Corporation, Armonk, NY (US)

( * ) Notice: Subject to any disclaimer, the term of this patent is extended or adjusted under 35 U.S.C. 154(b) by 846 days.

(21) Appl. No.: 11/955,689

(22) Filed: Dec. 13, 2007

(65) Prior Publication Data

US 2009/0158225 A1    Jun. 18, 2009

(51) Int. Cl.
*G06F 17/50* (2006.01)
(52) U.S. Cl. ........................................... 716/106
(58) Field of Classification Search ................ 716/1–18, 716/106
See application file for complete search history.

(56) References Cited

U.S. PATENT DOCUMENTS

| | | | |
|---|---|---|---|
| 5,892,682 A * | 4/1999 | Hasley et al. | 716/12 |
| 6,530,072 B1 | 3/2003 | Hagerman et al. | |
| 7,181,383 B1 | 2/2007 | McGaughy et al. | |
| 2002/0100005 A1 | 7/2002 | Anderson et al. | |
| 2003/0139842 A1 * | 7/2003 | Regnier | 700/182 |
| 2003/0200522 A1 * | 10/2003 | Roberts | 716/18 |
| 2005/0080502 A1 * | 4/2005 | Chernyak et al. | 700/97 |
| 2007/0044051 A1 | 2/2007 | McGaughy et al. | |
| 2008/0091981 A1 * | 4/2008 | Dokken et al. | 714/45 |

* cited by examiner

*Primary Examiner* — Vuthe Siek
*Assistant Examiner* — Aric Lin
(74) *Attorney, Agent, or Firm* — Scully, Scott, Murphy & Presser; Roy W. Truelson

(57) ABSTRACT

A method is disclosed that employs a hierarchical path database generator for accessing internal signal or port names in a design hierarchy of an integrated circuit design. The method comprises the steps of inputting design files into the hierarchical path database generator; and said hierarchical path database generator determining ports and signals in said design files, and storing the names of said ports and signals in a hierarchical database in a logical hierarchical order. The method comprises the further steps of providing a testcase to verify a defined aspect of the integrated circuit design; parsing the testcase to identify all signal and port names therein; and for each of the signal and port names identified in the testcase, inputting said each name into the hierarchical path database generator, and obtaining from that generator a hierarchical path associated with said each signal and port name.

14 Claims, 5 Drawing Sheets

METHOD AND SYSTEM FOR AUTOMATICALLY ACCESSING INTERNAL SIGNALS OR PORTS IN A DESIGN HIERARCHY

BACKGROUND OF THE INVENTION

1. Field of the Invention

This invention generally relates to the design of integrated circuits, and more specifically, the invention relates to an automated way of accessing internal signals or ports in the design hierarchy of an integrated circuit design.

2. Background Art

The process of creating Very-Large-Scale Integrated (VLSI) circuit designs typically includes a structured sequence of steps. In an initial step, a VLSI circuit designer creates a computerized representation of a VLSI circuit design using a computerized tool. In the ensuing steps, the designer generates a series of subsequent representations using specialized tools including synthesis tools, optimization tools, and place-and-route tools. The designer might also generate a new representation manually using a computerized editing tool.

In general, each representation in the series describes the design at a different level of abstraction. It is common for the initial representation to describe the design at a high level of abstraction, and for each subsequent representation to describe the design at a respective lower level of abstraction. For example, the initial representation may describe the design at the Register-Transfer Level (RTL), a subsequent representation may describe the design at the gate-level, and a subsequent representation from that may describe the design at the transistor-level. The process culminates with the generation of a database containing geometric detail of masks that will be used to fabricate the design.

A circuit design representation describes a design as a set of basic components that are connected together. Due to the size and complexity of VLSI circuit designs, it is a common practice for the designer to group components together in subsets called module definitions (or modules). A module defines an arrangement of components and other modules, and can be instantiated more than once in a representation. That is, the designer creates a module once to define an arrangement of elements, and uses instances of that module to represent specific portions of the design. Many Hardware Description Languages (HDLs) support this hierarchical manner of design description. Designs are written as a set of module definitions. Computerized tools that read such designs can construct the full hierarchical representation of the design from the module definitions. In the full hierarchical representation, each element of the design has a unique representation.

Once the circuit design is completed, the design is verified to ensure that the design adheres to certain rules and to verify that particular design aspects such as functional behaviors have been preserved from representation to representation. Verification is too often approached in an ad hoc fashion. Visually inspecting simulation results is no longer feasible and the directed test-case methodology is reaching its limits. In order to exercise the complex designs, various and comprehensive scenarios will be depicted in the form of test-cases. These test-cases usually range from hundreds to many thousands depending on the complexity of the design. These testcases which will be generated by the user are called directed testcases.

While generating these test-cases, access is usually needed to the internal ports or signals to verify the designs. Especially while doing the connectivity tests, the internal ports are used more often. In general, when the internal ports are used in the testcases, the complete hierarchy path is needed from the top module to the lower level module of these ports from the top design for test.

When the design is small, it may be relatively simple to provide the complete design path. But in today's world, as the design size increases and there are more blocks inside the design, the hierarchy path is long and very tedious to write in each and every testcases. The user has to remember the complete path. The process of writing the complete hierarchy path into each testcase is not automated, needs a lot of manual interaction, and is a very time consuming job. Also, if the block is realigned during floor planning or during the design stage, then the testcases needs to be remodified, which consumes even more time. As the time to market is very critical, the verification cycle time of the design is very critical and this leads to more time and manpower to finish this task.

Hence there is a need for the automation of the hierarchical path detection which will reduce the time and manual interaction and helps in finishing the verification task faster.

SUMMARY OF THE INVENTION

An object of this invention is to provide automated hierarchical path detection.

A further object of the invention is to resolve signal conflicts in a design hierarchy.

These and other objectives are attained with a method of accessing internal signal or port names in a design hierarchy of an integrated circuit design, and with a hierarchical path database generator that may be used in that method. The method includes inputting a multitude of design files into the hierarchical path database generator; said hierarchical path database generator determining ports and signals in said design files, and storing said ports and signals in a hierarchical database in a logical hierarchical order. Each of the ports and signals has a name.

The method further includes providing a test-case to verify a defined aspect of the integrated circuit design; parsing the test-case to identify all signal and port names therein; and for each of the signal and port names identified in the test-case, inputting said each name into the hierarchical path database generator, and obtaining from the hierarchical path database generator a hierarchical path associated with said each signal and port name, said hierarchical path being in the design hierarchy of the integrated circuit design.

In a preferred embodiment, the method further includes checking through the hierarchical database for signals and ports having conflicting names; and when conflicting names are found in the hierarchical database, changing some of said conflicting names to eliminate conflicts between the names. For example, the step of changing some of said conflicting names may include the step of changing each of said some of said conflicting names to a respective one symbolic name, and the step of parsing the testcase may includes the step of identifying all signal and port symbolic names in that testcase.

The preferred embodiment of the invention is used to derive automatically the Hierarchical Path Database Generation (HPDG). This database is used for hierarchy resolution and path detector. The preferred embodiment of the invention also resolves the conflict among the signals with very little human interaction in a verification environment. This preferred embodiment of the invention also provides an interface to the tool so that the invention works independently of different verification tools available from different vendors and independently of the hardware design language that is used for coding the low-level design files. The invention, in the preferred implementation, takes less memory space and less run time in the verification so that the invention can be embedded inside the tool and can be applied for the entire verification environment. The invention can also be integrated as a built-in feature inside the simulator.

Further benefits and advantages of this invention will become apparent from a consideration of the following detailed description, given with reference to the accompanying drawings, which specify and show preferred embodiments of the invention.

DETAILED DESCRIPTION OF THE PREFERRED EMBODIMENTS

The present invention, generally, relates to a method for accessing internal signal or port names in a design hierarchy of an integrated circuit design, and to a hierarchical path database generator that may be used in that method.

As mentioned above, once an integrated circuit design is completed, the design is verified to ensure that the design adheres to certain rules and to verify that particular design features have been preserved from representation to representation. A typical verification process employs a series of test-cases, and in fact the process may employ a large number of test-cases, for example hundreds or thousands of such test-cases. Many of these test-cases may refer to internal ports or signals of the circuit design, and many of these test-cases may need to include a description of a complete hierarchy path leading to an internal port or signal. With conventional verification processes, providing these test-cases with these complete hierarchy paths is very time consuming.

A preferred embodiment of the present invention effectively addresses this issue by automatically obtaining the hierarchy paths.

The invention is used with an integrated circuit design including a plurality of functional modules and a desired hierarchy among the plurality of functional modules. The desired hierarchy includes a top level to bottom level description of a defined hierarchy of the integrated circuit design. For example, in a typical integrated circuit design that would include millions of transistors, the integrated circuit design could include fifteen levels of hierarchy. Thus, if such a design was used in accordance with the method of the present invention, the desired hierarchy would include a top level through a bottom level wherein the bottom level is fourteen levels below the top level. Each of the levels in the desired hierarchy represents some functional distinction within the integrated circuit design.

The hierarchy typically includes a plurality of interconnection structures. Each of the interconnection structures is capable of describing interconnections within the integrated circuit design. In the situation where there are fifteen hierarchical levels, each level connects to at least one other level. At the highest level, the interconnection structure represents or includes input and output signals as well as signals that are transmitted to and received from lower hierarchical levels within the integrated circuit design. For each interconnection structure, respective interconnection data is inserted into the interconnection structures that describe interconnection of a respective module.

Figure 1:
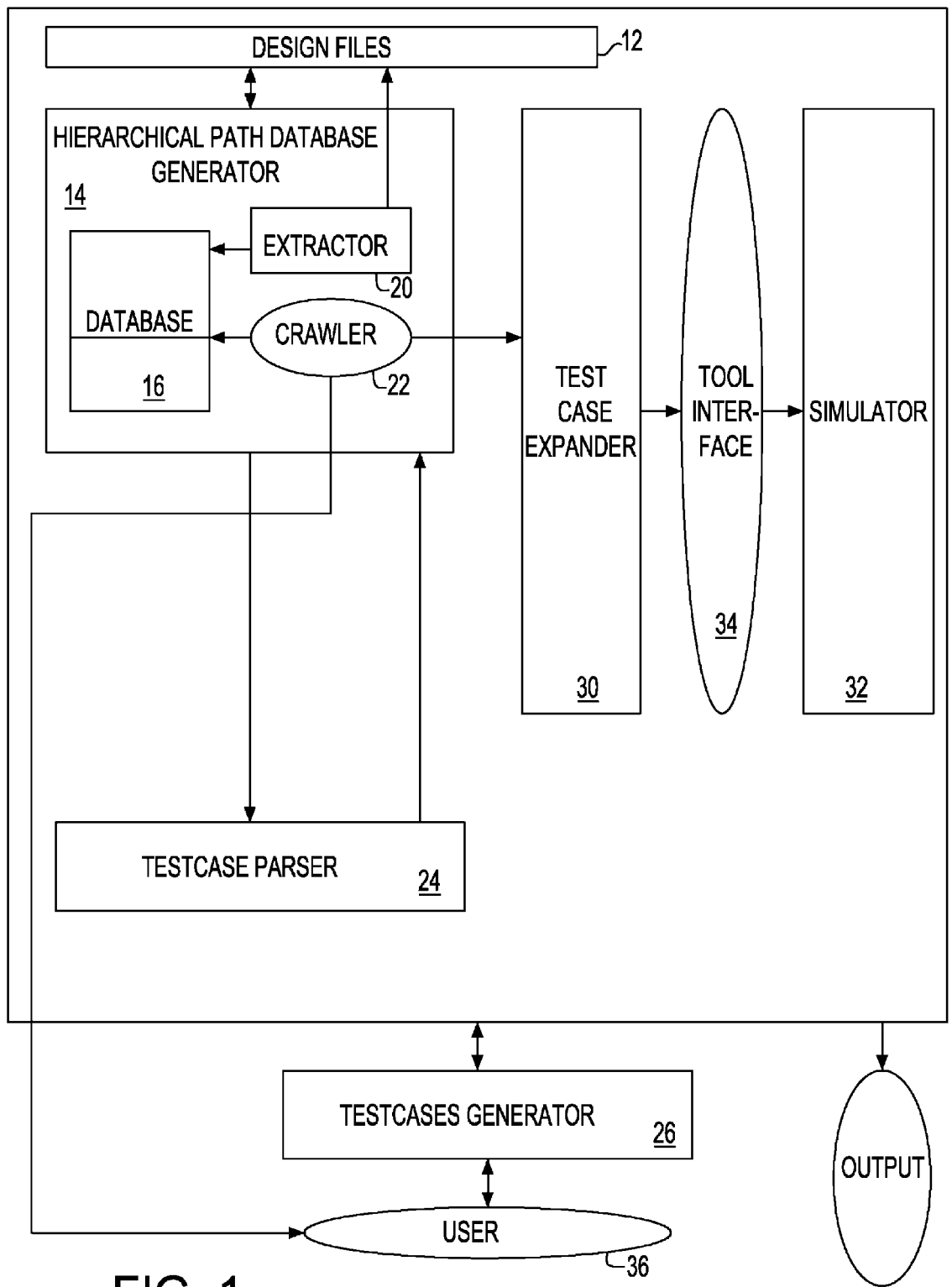
FIG. 1 is a block diagram showing the environment of the present invention.

FIG. 1 illustrates the environment in which the preferred embodiment of the invention is used. In this environment, the design files are represented at 12 and the Hierarchical Path Database Generator (HPDG) is represented at 14. Generator 14, in turn, includes database 16, extractor 20 and crawler 22. FIG. 1 also shows a test case parser 24, a test case generator 26, and a test case expander 30. A simulator tool is represented at 32, an interface to the simulator tool is represented at 34, and a user is represented at 36.

With reference to FIG. 1, input to the HPDG 14 is the design files 12, and the HPDG starts determining ports and signals or events associated with each module in the hierarchy from top to bottom of the hierarchy. The database generator is independent of the HDL, and for example, the generator supports Verilog/VHDL and other design languages used for coding the design files. The HDPG starts iteration from the top module. The extracted output of the signals and the port information with the hierarchy is stored in the database 16.

The extractor 20 and the crawler 22 are embedded inside the HPDG 14. The extractor is used for extracting the information from the design files 12 and for storing that information in the database 16. This is used for building the database. The crawler is used to search the port/signal path to extract the information from the database.

Figure 2:
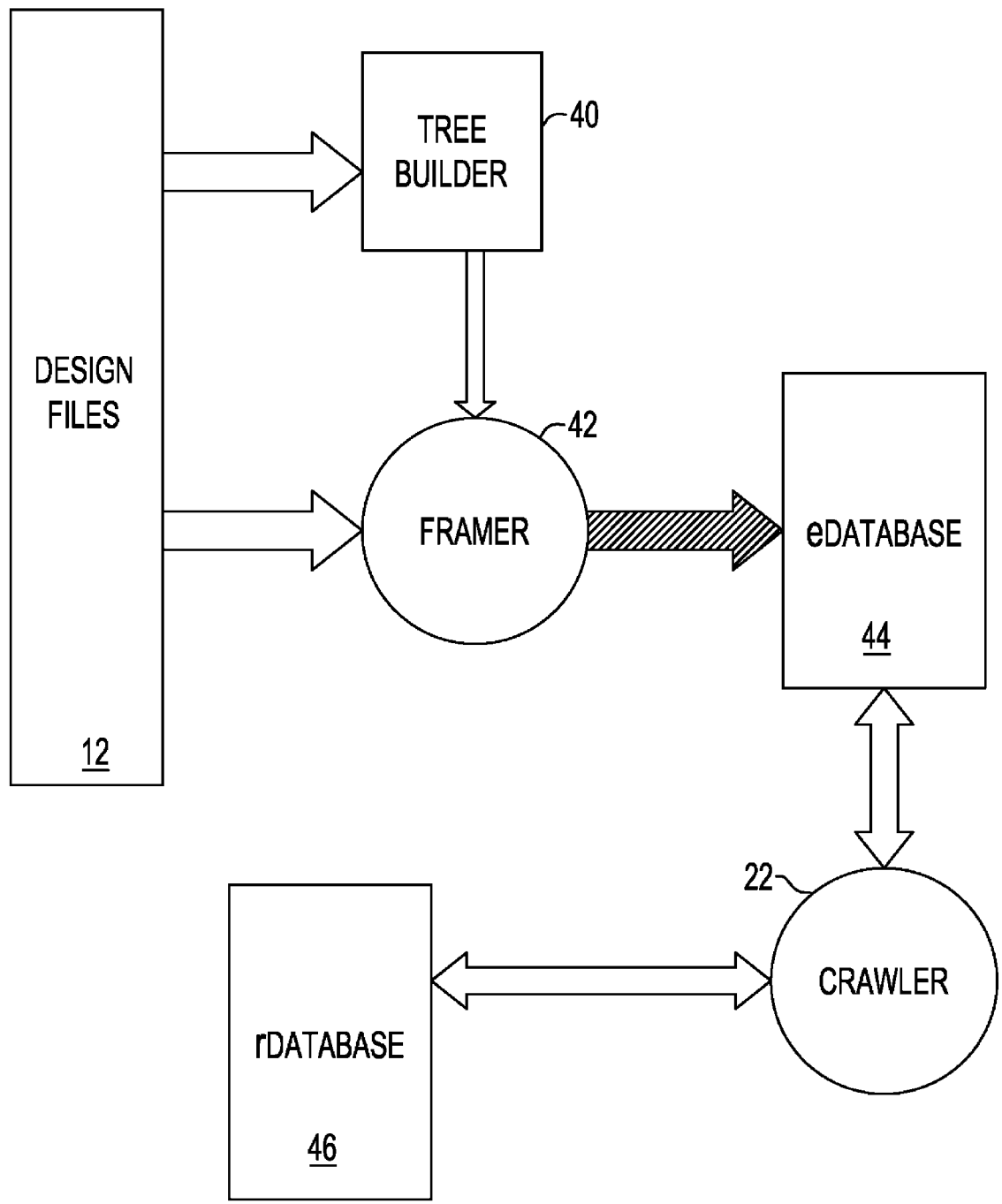
FIG. 2 shows in more detail the hierarchical path database extractor of FIG. 1.

The extractor 20 is the block used to build the database 16. With reference to FIG. 2, this block 20 comprises two sub blocks, tree (hierarchy) builder 40 and framer 42. The extractor block takes design (VHDL or Verilog) files as input files. The top file of the design needs to be specified to the extractor. The tree builder 40 contains an algorithm which will extract the name of the instantiated blocks (instance name) starting from the top instance. The tree builder will search through all the design files to extract all the instance names and their depth in the hierarchy. Based on the search results from the algorithm, the data is transformed into a tree structure. The parent node of the constructed tree will be the design top. The instance name of the various blocks will be child nodes. The depth of each child node will be decided based on the depth of search for that particular instance.

Once the tree structure is constructed, this structure is to input to the framer block 42. The framer block 42 is designed based on either a breadth first search or a depth first search, or any other suitable search algorithm. The main function of the framer block 42 is to traverse the tree structure and extract all the signals with respect to each instance name. By traversing through the tree, an extensive database is built of all the signals and ports, along with their hierarchy path starting from design top.

Figure 3:
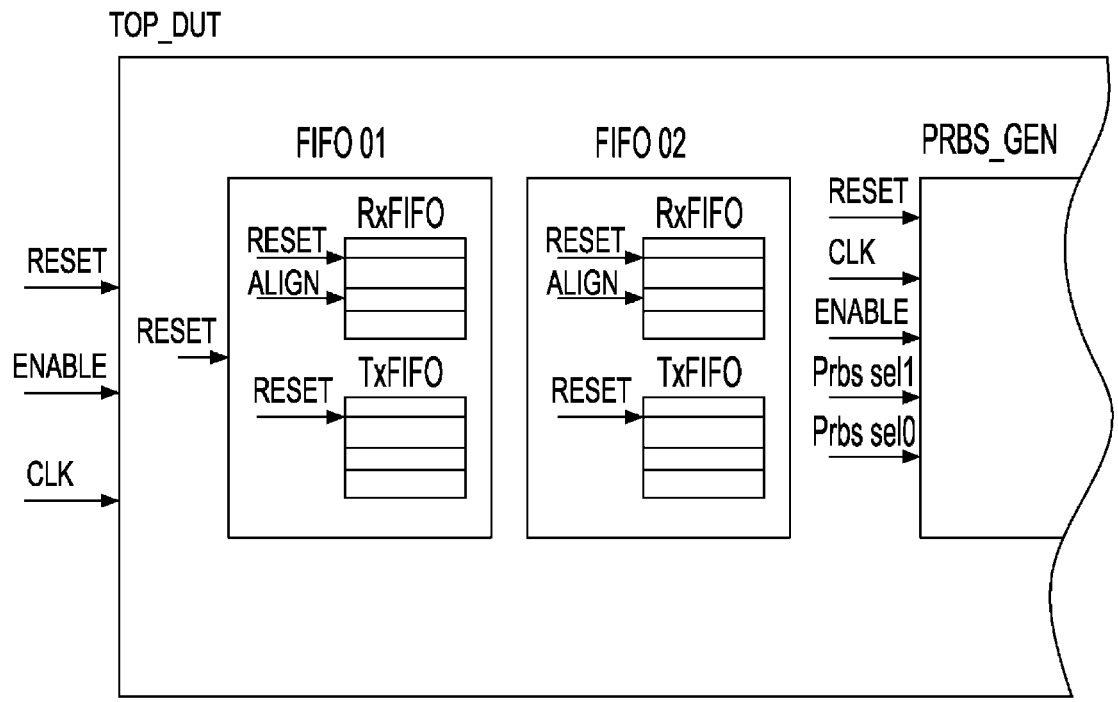
FIG. 3 illustrates a design structure with which the present invention may be used.
Figure 4:
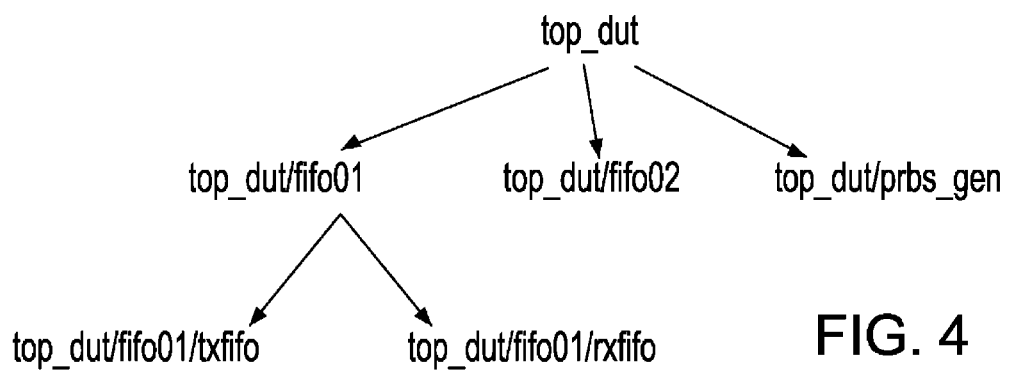
FIG. 4 shows a hierarchy tree structure formed from the design of FIG. 3 using the present invention.

The functionality of the extractor block 20 may be explained in detail by taking FIG. 3 design structure and FIG. 4 hierarchy tree structures as an example. The top_dut is fed to the extractor block along with the other design files. The tree builder 40 identified fifo01, fifo02 and prbs_gen as the instance names that are instantiated in the top_dut. The tree builder 40 attaches the depth to the instances and maps these instances as child nodes of top_dut. Further, the tree builder 40 repeats the process with all other instances found and thus builds a complete hierarchy of the design. The tree, once completed, looks like the diagram in FIG. 4, which is illustrative.

Figure 5:
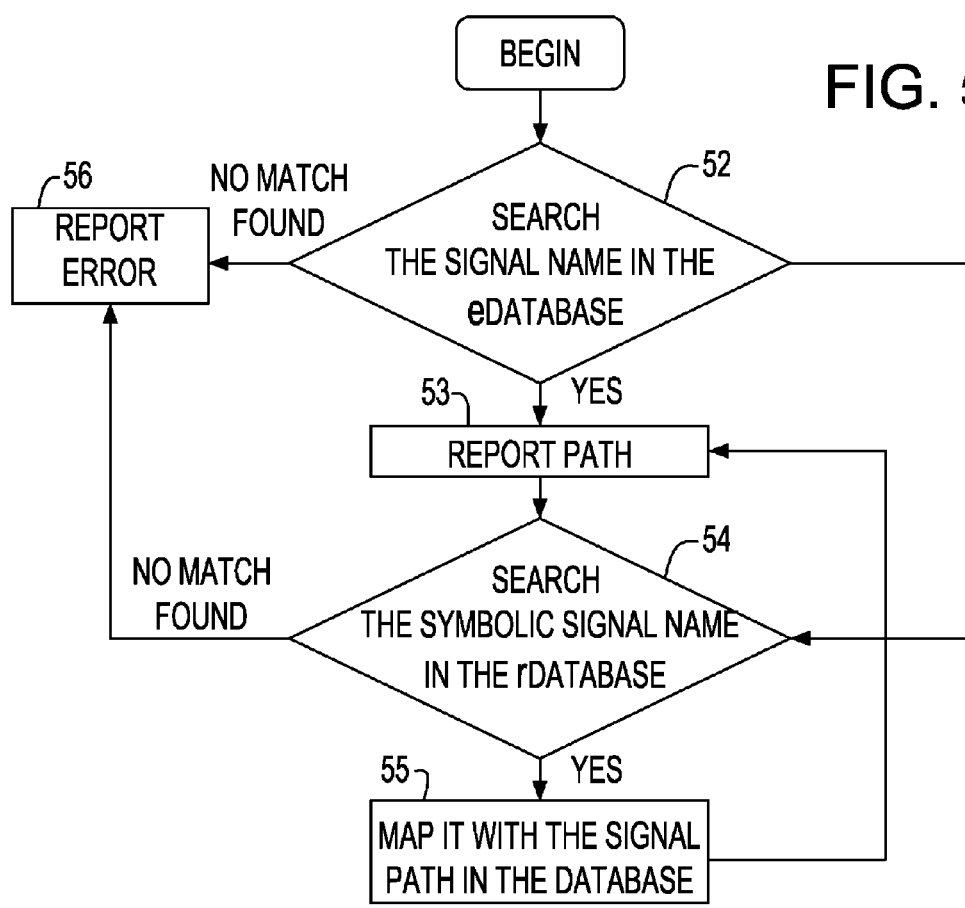
FIG. 5 illustrates a preferred conflict resolution algorithm used in the present invention.

The complete information of the signals and ports from top to bottom hierarchy are stored in a database 16. Once the database 16 is built, the crawler block 22 checks for the signals/port names from the database. If there are no conflicts among the signals/port names, then those names will be stored. If there is a conflict in the signals/ports names, the conflict resolution algorithm will resolve these conflicts. One suitable Conflict Resolution Algorithm (CRA) is shown in FIG. 5. This algorithm starts from the database output. Once a signals/ports name conflict is found, the crawler 22 replaces one of the conflicting names with a different name. The crawler 22 follows this method with the whole database and finally dumps the output will be referenced by the user, and the user just needs to give the signal name.

At step 52 of FIG. 5, the algorithm searches the names in an eDatabase 34. If a name is found, the algorithm, at step 53, reports the hierarchy path. If no name is found in the eDatabase, then, at step 54, the algorithm searches the symbolic names, discussed below, in the rDatabase 36. If a symbolic name is found, then, at step 55, that name is mapped with the signed path in the eDatabase, and the hierarchy path is reported at step 53. If neither the name nor the symbolic name are found in the eDatabase or the rDatabase, then an error report is issued at step 56.

For example, referring to FIG. 4, the reset signal is in the top_dut/fifo01/txfifo/RESET and top_dut/fifo01/txfifo/RESET1 and top_dut/fifo01/rxfifo/RESET2 and outputs these as output file for the user reference. When a user wants to use top_dut/fifo01/txfifo/RESET and top_dut/fifo01/rxfifo/RESET testcase the user specifies these as RESET1 and RESET2.

The input of the Crawler 22 is the eDatabase 44, which is built by the extractor block 20. The Crawler 22 has a conflict resolution block. The Crawler 22 identifies all the conflicting signals and builds an rDatabase 46. Each of the conflicting signals will be attached to a symbolic name. The Crawler 22 itself will generate these symbolic names. The Crawler 22 will then map the symbolic name and conflicting signals using, for example, hash functions. The symbolic name will be the key in the hash, and the conflicting signal along with the hierarchy path will be the value in the hash list. The symbolic names of all the conflicting signals will be presented to the user. The user will use these symbolic names when referring to signals/port names that are in conflict. Hence, this preferred method helps in minimizing the hierarchy path and thus allows user to use only symbolic name for conflicted signals and to use the signal name directly for non-conflicting signals.

An advantage of the present invention is that, when the user is writing a test-case and the user wants to drive either the internal signal or the port name in some level of the hierarchy, the user only needs to input the signal name or the symbolic name. This is in contrast with the current industry standard verification environment, where the user needs to give the complete hierarchy path. With the preferred embodiment of the present invention, the input of this test-case will be given to the test-case parser 24, which extracts the signal name and feeds this into the hierarchical path database generator 14. The crawler 22 in the generator decodes this signal, and if this signal name is found in the database 16, the crawler 22 passes the hierarchical path to the test-case expander.

Figure 6:
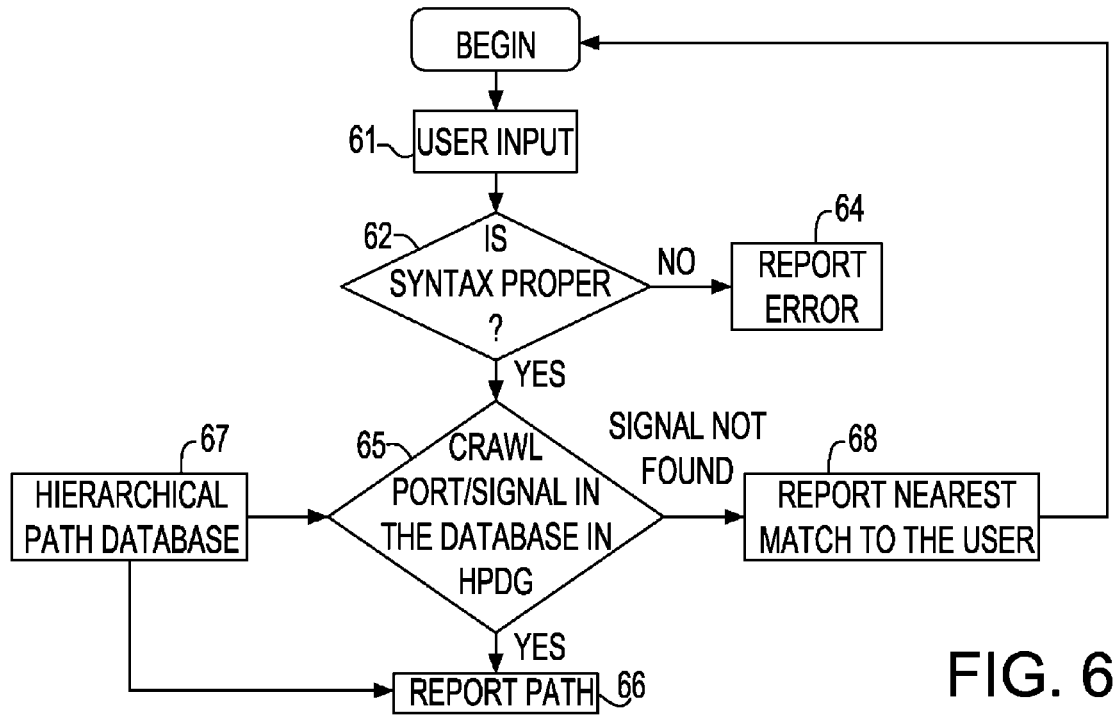
FIG. 6 shows a hierarchy resolution algorithm that is used in the preferred embodiment of this invention.

This follows the flow of hierarchy resolution algorithm FIG. 6. With the Hierarchy resolution procedure illustrated in FIG. 6, user input is provided at step 62; and at step 63, the syntax of that input is checked. If the syntax is incorrect, an error report is generated at step 64. If the syntax is correct, the algorithm proceeds to step 65, where the crawler 22 searches through the port/signal names in the HPDG database 16. If the port/signal name is not found in the database, a nearest match may be reported to the user at step 66. If the port/signal name is found in the database, then the hierarchy path is reported to the user at step 67. This path may come from the hierarchical path database, as represented at step 67.

Figure 7:
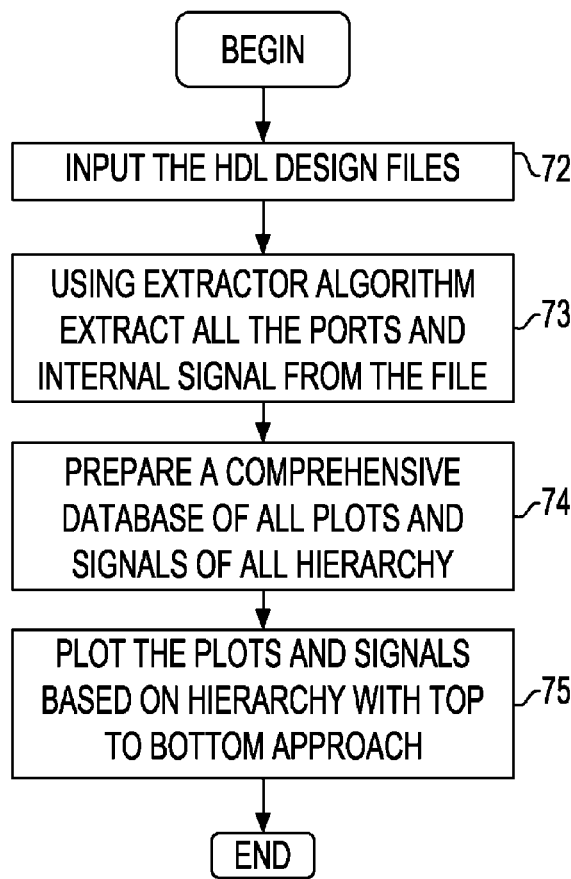
FIG. 7 illustrates hierarchical path database generation in accordance with a preferred embodiment of the invention.

FIG. 7 shows a preferred hierarchical path database generation procedure. At step 72, the design files are input to the hierarchical path database generator 14; and at step 73, an extraction algorithm is used to extract all the ports and internal signals from the files. A comprehensive database of all the ports and signals of all the hierarchy is prepared at step 74. At step 75, the ports and signals are plotted based on the hierarchy and using a top-to-bottom approach.

The method of this invention can be enhanced by providing Graphical User Interface [GUI] to make it more user friendly. The method of the present invention can also be enhanced by integrating this method inside the tool irrespective of the verification environment by reusing the compiled design files database which is already available in the tool.

The instant invention has a number of additional important features. For example, the invention substantially reduces the amount of manual interaction needed when test-cases are written, helps in connectivity tests, and due to less manual interactions, reduces the manual activity and increases the productivity. This invention can be further enhanced by embedding the HPDG inside the simulator tool and can be applied to the entire verification environment. The invention supports all design coding styles and hence it is independent of the design language. The invention will not add up to run time, as these will be done during compilation. Also, if the signal name is changed from an old name to a new name, the HPDG remembers the old name and replaces it with the new name. In this way, the HPDG gives the user the option about closest available signals so that user can choose which signal he needs to add in the testcase. This invention is easily implementable and is very user friendly, and the invention will be applicable for test verification or circuit design verification. The invention is applicable wherever path detection is required.

As will be readily apparent to those skilled in the art, the present invention, or aspects of the invention, can be realized in hardware, software, or a combination of hardware and software. Any kind of computer/server system(s)—or other apparatus adapted for carrying out methods described herein—is suited. A typical combination of hardware and software could be a general-purpose computer system with a computer program that, when loaded and executed, carries out the respective methods described herein. Alternatively, a specific use computer, containing specialized hardware for carrying out one or more of the functional tasks of the invention, could be utilized.

Figure 8:
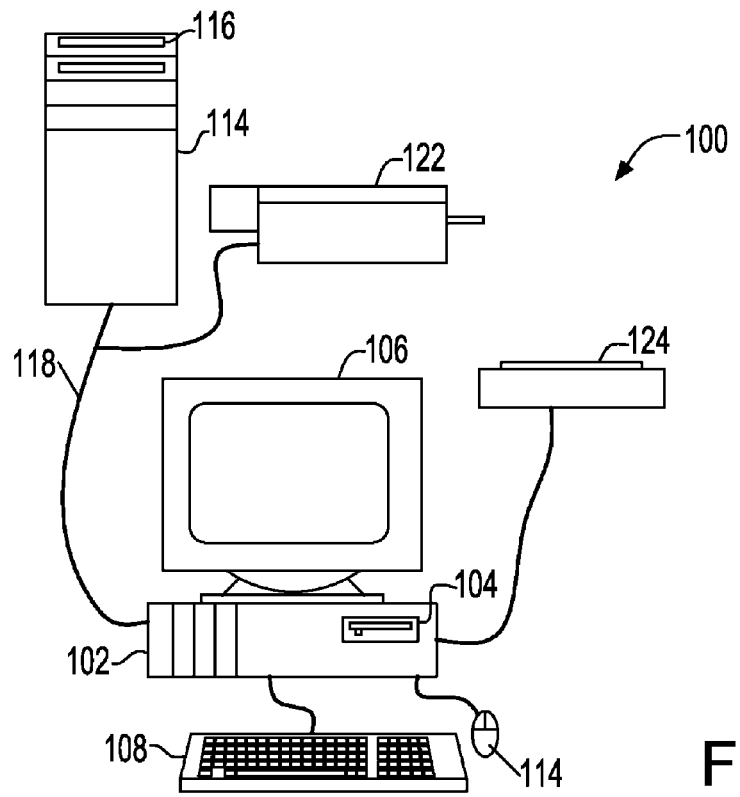
FIG. 8 depicts a computer system that may be used to carry out this invention.

For example, FIG. 8 illustrates a computer system 100 which may be used in the implementation of the present invention may be carried out. Computer system includes a processing unit 102 that houses a processor, memory and other systems components that implement a general purpose processing system that may execute a computer program product comprising media, for example a floppy disc that may be read by processing unit 102 through floppy drive 104.

The computer program product may also be stored on hard disk drives within processing unit 102 or may be located on a remote system 114 such as a server 116, coupled to processing unit 102, via a network interface, such as an Ethernet interface. Monitor 106, mouse 114 and keyboard 108 are coupled to processing unit 102, to provide user interaction. Scanner 122 and printer 124 are provided for document input and output. Printer 124 is shown coupled to processing unit 102 via a network connection, but may be coupled directly to the processing unit. Scanner 122 is shown coupled to processing unit 102 directly, but it should be understood that peripherals may be network coupled or direct coupled without affecting the ability of workstation computer 100 to perform the method of, or aspects of, the invention.

The present invention, or aspects of the invention, can also be embodied in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of associating internal signals or ports in a design hierarchy of an integrated circuit design with a testcase to verify a defined aspect of the integrated circuit design, said design including a multitude of design files, the method comprising the steps of:
   inputting design files into a hierarchical path database generator; said hierarchical path database generator determining ports and signals in said design files, and storing said ports and signals in a hierarchical database in a logical hierarchical order, each of the ports and signals having a respective internal name local to a respective node of said integrated circuit design hierarchy and a path corresponding to the respective node;
   providing said testcase to verify a defined aspect of the integrated circuit design, said testcase specifying a plurality of internal signal or port names, each said internal signal or port name being local to a respective node of said integrated circuit design hierarchy and being specified without specifying a corresponding path name of the corresponding signal or port in the design hierarchy said integrated circuit design;
   responsive to providing said testcase to verify a defined aspect of the integrated circuit design, automatically parsing the testcase to identify at least some internal signal or port names therein; and
   for each of the internal signal and port names identified by said parsing the testcase, inputting the respective internal signal or port name into the hierarchical path database generator, and obtaining from the hierarchical path database generator a respective hierarchical path associated with the respective internal signal or port name for use by said testcase in accessing the corresponding signal or port, each said hierarchical path being in the design hierarchy of the integrated circuit design.

2. The method according to claim 1, comprising the further steps of:
   checking the hierarchical database for signals and ports in different nodes having conflicting internal signal or port names; and
   when conflicting internal signal or port names are found in the hierarchical database, changing some of said conflicting internal signal or port names to eliminate conflicts between the names.

3. The method according to claim 2, wherein the step of changing some of said conflicting internal signal or port names includes the step of changing each of said some of said conflicting names to a respective one symbolic name.

4. The method according to claim 3, wherein the step of parsing the testcase includes the step of identifying all signal and port symbolic names in the testcase.

5. The method according to claim 2, wherein the step of checking through the hierarchical database includes the step of checking through said database for signals and ports having internal signal or port names that are the same.

6. The method according to claim 1, wherein said design files are arranged in a top-to-bottom order.

7. The method according to claim 6, wherein the step of determining ports and signals in said design files includes the step of extracting all of a defined group of instance names in the design files.

8. The method according to claim 7, wherein the step of determining ports and signals in said design files includes the further steps of identifying some of the extracted instance names as parent nodes, and identifying others of the extracted instance names as child nodes.

9. The method according to claim 8, wherein the step of storing said ports and signals in the hierarchical database in the logical hierarchical order includes the step of forming a tree structure from the parent and child nodes.

10. The method according to claim 9, comprising the further step of traversing the tree structure to identify conflicting instance names in the hierarchical database.

11. An article of manufacture comprising a program storage device readable by computer, tangibly embodying a program of instructions executable by the computer to perform method steps for associating internal signals or ports in a design hierarchy of an integrated circuit design with a testcase to verify a defined aspect of the integrated circuit design, said design including a multitude of design files, said method steps comprising:
   receiving said design files in a hierarchical path database generator;
   said hierarchical path database generator determining ports and signals in said design files, and storing said ports and signals in a hierarchical database in a logical hierarchical order, each of the ports and signals having a respective internal name local to a respective node of said integrated circuit design hierarchy and a path corresponding to the respective node;
   receiving from a testcase, used to verify a defined aspect of the integrated circuit design, specified internal signal and port names, each said internal signal or port name being local to a respective node of said integrated circuit design hierarchy and being specified without specifying a corresponding path name of the corresponding signal or port in the design hierarchy said integrated circuit design; and responsive to receiving from a testcase specified internal signal and port names, for each of the specified signal and port names, inputting the respective name into the hierarchical path database generator, and obtaining from the hierarchical path database generator a respective hierarchical path associated with the respective signal or port name for use by said testcase in accessing the corresponding signal or port, each said hierarchical path being in the design hierarchy of the integrated circuit design.

12. The article of manufacture according to claim 11, wherein said method steps further comprise:

checking through the hierarchical database for signals and ports in different nodes having conflicting internal signal or port names; and when conflicting internal signal or port names are found in the hierarchical database, changing some of said conflicting internal signal or port names to eliminate conflicts between the names.

13. The article of manufacture according to claim 12, wherein the step of changing some of said conflicting internal signal or port names includes the step of changing each of said some of said conflicting names to a respective one symbolic name.

14. The article of manufacture according to claim 12, wherein the step of checking through the hierarchical database includes the step of checking through said database for signals and ports having internal signal or port names that are the same.

* * * * *